(12) United States Patent
Bridge (10) Patent No.: US 6,396,250 B1
(45) Date of Patent: May 28, 2002

(54) CONTROL METHOD TO REDUCE BODY DIODE CONDUCTION AND REVERSE RECOVERY LOSSES

(75) Inventor: Christopher David Bridge, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/652,456

(22) Filed: Aug. 31, 2000

(51) Int. Cl.[7] .................................................. G05F 1/40
(52) U.S. Cl. ...................................... 323/283; 323/284
(58) Field of Search ................................ 323/284, 283, 323/287, 290

(56) References Cited

U.S. PATENT DOCUMENTS

| | | |
|---|---|---|
| 4,654,769 A | 3/1987 | Middlebrook |
| 5,532,577 A | 7/1996 | Doluca |
| 5,627,460 A | 5/1997 | Bazinet et al. |
| 5,905,370 A | 5/1999 | Bryson |
| 5,943,227 A | 8/1999 | Bryson et al. |
| 6,057,607 A * | 5/2000 | Rader, III et al. ........... 323/274 |
| 6,157,182 A * | 12/2000 | Tanaka et al. ............... 323/284 |

OTHER PUBLICATIONS

"Synchronous Rectifier Controller IC Simplifies and Improves Isolated DC–DC Converter Designs," by H.P. Yee., Feb. 2000 pp. 44–51, PCIM.

"Integrated Controller IC Boosts Efficiency of Synchronous Rectifier–Based Converter," by Edgar Abdoulin, PCIM, Mar. 2000 pp. 42–52.

* cited by examiner

*Primary Examiner*—Shawn Riley
(74) *Attorney, Agent, or Firm*—W. Daniel Swayze, Jr.; W. James Brady; Frederick J. Telecky, Jr.

(57) ABSTRACT

A DC-to-DC converter to convert a first DC voltage to a second DC voltage includes a first switch connected to input the first DC voltage, a second switch, the first switch and the second switch being controlled by an input signal to generate the second DC voltage, the first switch and the second switch being connected to a control reference, and a control circuit to control the delay of the input signal by monitoring the control reference around an optimal delay point.

10 Claims, 8 Drawing Sheets

FIG. 14
BUCK: (DOWN)

FIG. 15
BOOST: (UP)

FIG. 16
BUCK-BOOST: (UP/DOWN)

CONTROL METHOD TO REDUCE BODY DIODE CONDUCTION AND REVERSE RECOVERY LOSSES

FIELD OF THE INVENTION

The present invention relates to the field of power supplies and, more particularly, to DC-DC converters, isolated converters or switching regulators wherein controlling the primary and secondary output voltages is desired.

BACKGROUND OF THE INVENTION

Switching regulators, including ripple regulators, are commonly used because of their characteristic of high efficiency and high power density (i.e., power-to-volume ratio) resulting from smaller magnetic, capacitive, and heat sink components. In current mode control, switching regulators indirectly regulate an average DC output voltage by selectively storing energy by switching energy on and off in an inductor. By comparing the output voltage to a reference voltage, the inductor current is controlled to provide the desired output voltage. The above refers to current mode control; other modes of control include voltage mode control. Ripple regulators use other methods.

Synchronous buck power stages are a specific type of switching regulator that use two power switches such as power MOSFET transistors. A high-side switch selectively couples the inductor to a positive power supply while a low-side switch selectively couples the inductor to ground. A pulse width modulation (PWM) control circuit is used to control the high-side and low-side switches. Synchronous buck regulators provide high efficiency when low on-resistance power MOSFET devices are used.

With increased demand for low voltage power, the synchronous rectifier (SR) is now an important circuit element in the DC-DC converter mainstream. One such use of the synchronous rectifier is the low-side switch in buck power stages.

The added emphasis on synchronous rectification is also posing design problems for the DC-DC converter designer. The synchronous rectifier is generally more difficult to use than a traditional diode rectifier. Typical SR design considerations include gate timing control, gate driver, and reverse conduction. However, because traditional diode rectifiers can account for over 50% of the total power loss in modern 3.3V output converters (significantly higher for lower output converters), more and more converters are being forced to use the more efficient SR, despite its complexity. However, significant power losses are still resulting from the delay necessary for switching on states between the high side and low side to prevent the simultaneous conduction of the high-side and the low-side switches. To maximize power efficiency, it is desirable to minimize the delay times to an optimal level, while preventing simultaneous cross-conduction of the high-side and low-side switches.

A pulse width modulating control circuit is used to control the high-side and low-side switches. However, it has been found that controlling the timing of the high-side switch and the low-side switch has resulted in inefficient operation due to body diode conduction in the low-side switch.

As before, PWM isn't the only technique. Ripple regulators and pulse frequency modulation (PFM) are other techniques which are popular. Inside PWM techniques are three methods which include voltage mode, peak current mode and average current mode.

SUMMARY OF THE INVENTION

The present invention is applicable for a buck circuit, a boost circuit, and a buck-boost circuit as well as the isolated topologies derived from buck, boost and buck-boost in order to accurately control the time that the high-side driver is on with respect to the low-side driver. More particularly, the present invention senses the voltage of the terminal between the high-side switch and the low-side switch to provide an indication of how long to delay the pulse to activate the high-side switch or the low-side switch.

The circuit of the present invention is predictive and learning by the operation of the circuit itself. The present invention sets time delays to a minimum value to avoid shoot-through current. By use of a learning circuit, the present invention responds to component and parameter changes, keeping the minimum delay time. Since the circuit of the present invention is predictive, and most time delays are temperature dependent, temperature variation is easily compensated for. By minimizing the non-overlay times, where the body diode of a SR conducts, power losses are minimized.

The present invention controls the delay times by monitoring the voltage across the SR drain-to-source to detect if the body diode is conducting. The circuit then can adjust the delay to be longer or shorter to minimize the conduction of the body diode.

BRIEF DESCRIPTION OF THE DRAWINGS

FIGS. 4(a–c) illustrates graphs of various voltages associated with the buck converter measured with respect to delay;

DETAILED DESCRIPTION OF THE PRESENT INVENTION

Figure 1:
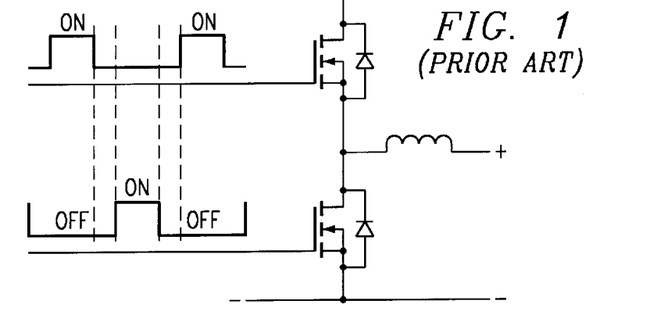
FIG. 1 illustrates a buck or boost circuit.
Figure 2:
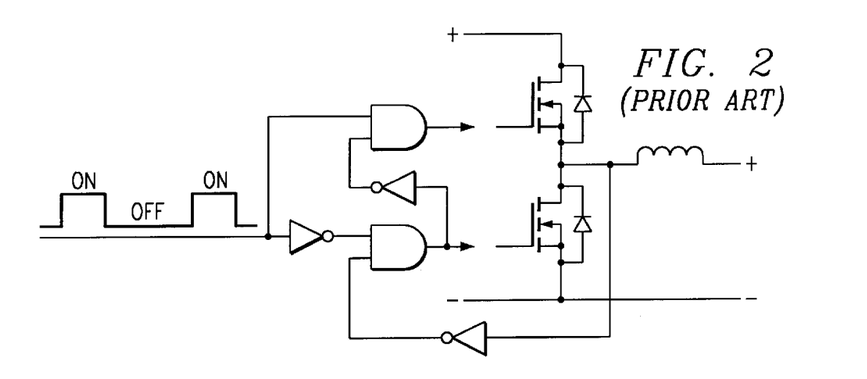
FIG. 2 illustrates another buck or boost circuit.

FIG. 1 and FIG. 2 illustrate a buck or boost circuit.

Figure 3:
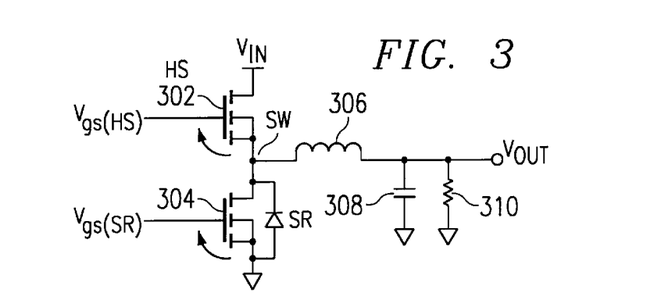
FIG. 3 illustrates the high-side and low-side switches for a circuit of the present invention.

FIG. 3 illustrates a high-side switch designated as element 302 and a low-side switch designated as element 304. As illustrated in FIG. 3, the low-side switch 304 is implemented as a synchronous rectifier. The high-side switch 302 is driven by gate drive signal voltage $V_{GS}$ which is supplied to the gate with respect to the source of the high-side switch 302. Likewise, gate drive signal voltage $V_{GS}$ is applied to the gate of low-side switch 304. The signals applied to the high-side switch 302 and to the low-side switch 304 are applied alternatively to either the high-side switch 302 or the low-side switch 304 to provide a reduced average voltage at terminal SW. An inductor 306 is connected to SW, and at the other terminal of said inductor, a capacitor 308 is connected to the inductor 306 with the other end of the capacitor 308 being connected to ground. Additionally, connected to the other end of inductor 306 is a resistor 310 with the other end of the resistor 310 being connected to ground. The resistor 310 represents the load of the buck circuit. The function of the capacitor 308 is to remove unwanted noise from the output of the inductor 306. Consequently, a reduced $V_{OUT}$ is formed at the other end of inductor 306.

Figure 4A:
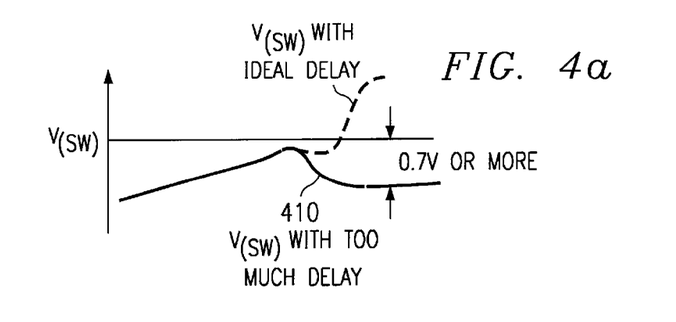

FIGS. 4(a–c) illustrates the various voltages as a function of delay time whereas the delay time is the delay between the rising edge of voltage $V_{GS}$ high side (HS) and the falling edge of voltage $V_{GS}$ low side (LS). As illustrated in FIG. 4a, the voltage at terminal SW increases in a somewhat linear fashion until point 410 which represents the optimal voltage $V_{SW}$ for switching between the rising edge of voltage $V_{GS}$ (HS) of the high side switch 302 and the falling edge of voltage $V_{GS}$ (LS) of the low-side switch 304. The voltage at terminal SW is used as a control reference. As the delay time is increased beyond point 410, the voltage SW drops off rapidly and approximately linearly and eventually levels off to a point in one embodiment that represents 0.7 volts or more between the voltage (SW) and the zero voltage. Clearly, for delays beyond point 410, the delay between the falling edge of $V_{GS}$ (LS) and the rising edge of $V_{GS}$ (HS) is too long.

Figure 4B:
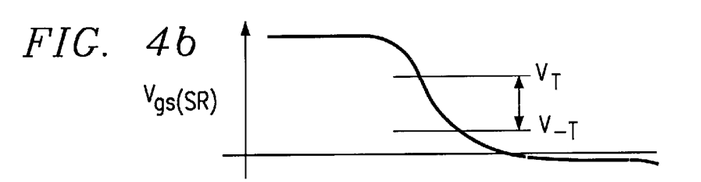

FIG. 4b illustrates the gate drive signal voltage $V_{GS}$ (LS) of the low-side switch 304 or, as illustrated in FIG. 3, the synchronous rectifier. The voltage $V_{GS}$ (SR) in this graph remains high to turn on the low-side switch 304 until the ideal switching time, illustrated in FIG. 4 as point 410. Then after point 410, the voltage $V_{GS}$ (LS) is reduced significantly below a threshold voltage of the gate-to-source of the low-side switch 304 or to zero, illustrated as the synchronous rectifier.

Figure 4C:
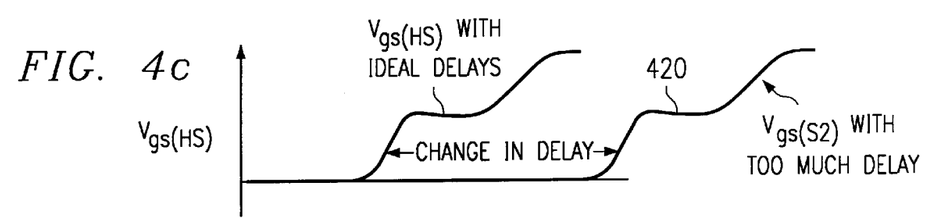

Turning now to FIG. 4c, the voltage $V_{GS}$ (HS) of the high-side switch applied to the gate-to-source is illustrated. The voltage remains essentially zero until the ideal switching time illustrated by point 410 set by the present invention. It rises rapidly, reaches a plateau, and then rises again significantly as the switch closes. A second curve 420 illustrates too much delay. Alternately, voltage $V_{GS}$ (HS) may rise before voltage $V_{GS}$ (LS) starts to fall.

Figure 5:
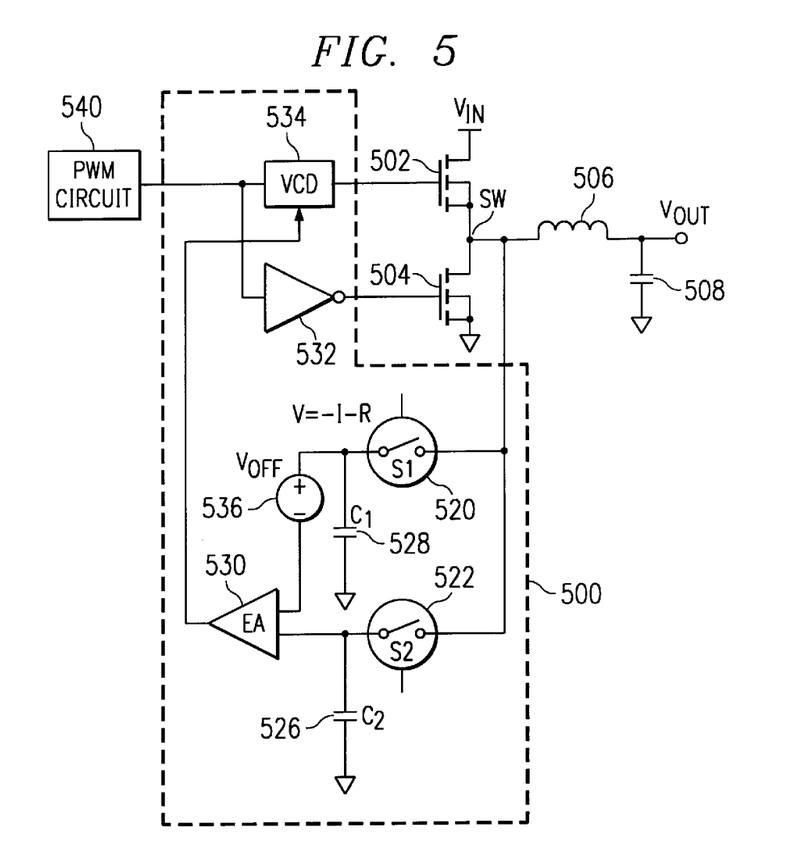
FIG. 5 illustrates an analog circuit of the present invention.

Turning now to FIG. 5, FIG. 5 illustrates an analog implementation of the control circuit 500 of the present invention. FIG. 5 illustrates two power MOSFET transistors 502 and 504 to be used as the high-side switch and the low-side switch, respectively. A high-side MOSFET transistor 502 is connected to voltage $V_{IN}$ and connected through the source of high-side MOSFET transistor 502 to the drain of low-side MOSFET 504. Terminal SW is positioned between the source of high-side MOSFET 502 and the drain of MOSFET 504. The terminal SW is connected to one end of inductor 506. Inductor 506 may be a single coil or a transformer having two or more isolated coils. Additionally, as illustrated, the other end of inductor 506 is connected to capacitor 508. The other end of capacitor 508 is connected to ground. Terminal SW is also connected to switch 520 and switch 522. The switches 520 and 522 are connected in parallel by virtue of their connection to terminal SW. Switch 520 is connected to offset voltage generator 536 and also is connected to capacitor 528. Switch 522 is connected to operational amplifier 530 and connected to capacitor 526. The amplifier 530 is connected to the voltage control delay circuit 534. The voltage control delay circuit 534 delays the input voltage to the high-side switch illustrated as a power MOSFET in accordance with the output of amplifier 530. The input to the voltage control delay circuit 534 is a PWM signal from PWM circuit 540 which controls the width of the digital pulse of the input signal to the voltage control delay circuit 534. While the PWM is shown, other techniques such as PFM may be used. PWM may include voltage mode, peak current mode and average current mode. Any pulse signal will work equally well.

The voltage control delay circuit 534 controls the high-side switch 502 illustrated as the power MOSFET by controlling the voltage of the gate-to-source of power MOSFET 502. The inverter 532 is connected to the output of the PWM circuit 540. The output of the PWM circuit 540 is input to inverter circuit 532. The output of the inverter circuit 532 is an inverted signal, for example, in this case, the inverted PWM signal. The inverter circuit 532 controls the low-side switch 505, illustrated as power MOSFET or synchronous rectifier, by controlling the voltage of the gate of the low-side switch 504. The voltage $V_{OUT}$ is controlled by the input voltage $V_{IN}$ and is controlled by the period of time that high-side switch 502 is activated by the PWM circuit 540. The longer the high-side switch 502 is turned on, the higher the voltage $V_{OUT}$ is. Thus, the average voltage at terminal SW is controlled by the amount of time that the high-side switch 502 is turned on and corresponds directly to the voltage $V_{OUT}$.

A feedback loop including switch 520, switch 522, capacitor 528, capacitor 526, offset voltage circuit 536, and amplifier 530 is used to control the voltage control delay circuit 534 so that sufficient time is provided between the rising edge of a pulse output from the voltage control delay circuit 534 to control the high-side switch 502 and the falling edge of a pulse of the low-side power MOSFET 504 output from inverter 532. The switch 520 is closed during the channel conduction of the synchronous rectifier or low-side switch 504. The switch 522 is closed during the body diode conduction of the body diode associated with low-side power MOSFET 504 illustrated as a synchronous rectifier.

The offset voltage circuit 536 is used to avoid the cross-conduction of switch 520 and switch 522 by adding a small offset to the voltage across capacitor 528. The offset 536 ensures that the delay isn't adjusted to be too short. Thus, the voltage that is input to amplifier 530 through switch 520 is decreased by the voltage of offset voltage circuit 536. Capacitor 528 and capacitor 526 both sample and hold the voltage from the output of switch circuit 520 and switch circuit 522, respectively. Thus, when the low-side switch 504 is activated such that the channel of the low-side switch 504 conducts, the switch 520 is closed to induce the voltage SW to the capacitor 528. The voltage SW is reduced by the voltage output from the offset circuit 536. In a similar fashion, when the low-side switch 504 is operating such that the body diode of low-side switch 504 is operating, the switch 520 is open, and the switch 522 is closed, inducing the voltage during this period of time at terminal SW into the amplifier 530. The output of amplifier 530 is used to control the voltage control delay circuit 534. One delay block 534 and associated control circuitry is shown. A complete system would have replicated circuitry such as 534, 520, 522, 526, 528, 536, 530. The second delay block would delay the (SR or LS) gate voltage.

Figure 6:
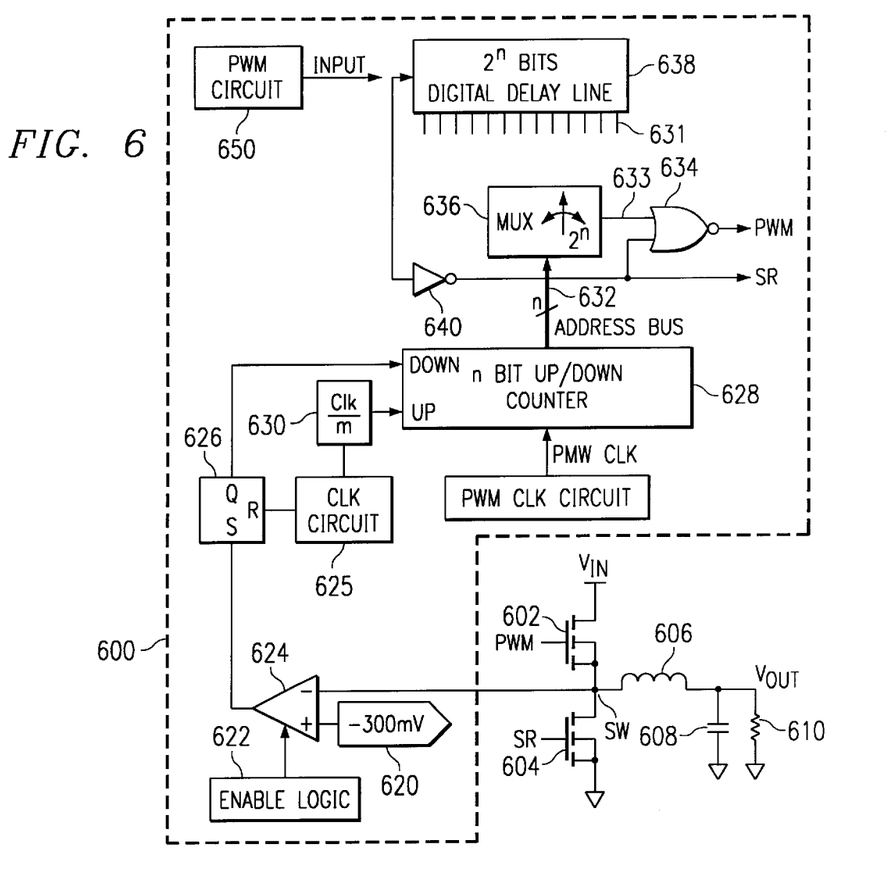
FIG. 6 illustrates a digital circuit of the present invention.

FIG. 6 illustrates that the high-side switch and low-side switch are implemented as high-side power MOSFET 602 and low-side power MOSFET 604.

Turning now to FIG. 6, FIG. 6 illustrates a digital embodiment of the control circuit 600 of the present invention. As illustrated in FIG. 6, a high-side power MOSFET 602 is connected to low-side power MOSFET 604. The low-side power MOSFET 604 is a synchronous rectifier. In this implementation this is a buck converter. The drain of high-side power MOSFET 608 is connected to voltage $V_{IN}$ while the source of high-side power MOSFET 602 is connected to the drain of low-side power MOSFET 604. The source of low-side power MOSFET 604 is connected to ground. The connection point between the high-side power MOSFET 602 and the low-side power MOSFET 604, which is a synchronous rectifier, is connected to terminal SW. Terminal SW is connected to inductor 606. The other end of inductor 606 is output voltage $V_{OUT}$. Additionally, connected to the other end of inductor 606 is capacitor 608 and resistor 610 to load capacitor 608; both capacitor 608 and resistor 610 are connected in parallel, and each of the other ends of capacitor 608 and resistor 610 are connected to ground. Additionally, the comparator 624 is connected to terminal SW. More particularly, the negative input of comparator 624 is connected to terminal SW. Additionally, a voltage circuit 620 to generate a voltage is connected to the plus input of comparator 624. Enable logic circuit 622 may be connected to comparator 624 to control the operation of comparator 624. The output of comparator 624 is connected to S-R latch 626. More particularly, the output of comparator 624 is connected to the set(s) input of S-R latch 626. A clock circuit 625 is connected to the reset input of S-R latch 626 to input a clock signal to S-R latch 626. The output of S-R latch 626 is connected to up/down counter 628. More particularly, the output of S-R latch 626 is connected to the down input of up/down counter 628. An output signal from the S-R latch 626 causes the up/down counter 628 to count down. A divide circuit 630 is connected to the up input of up/down counter 628. An output signal from the divide circuit 630 causes the up/down counter 628 to count up when counter 628 is clocked by PWM clock circuit 660. The output of up/down counter 628 is input to a mux circuit 636. The output of the up/down counter 628 represents an address used to address a location of the digital delay line 638. The output of digital delay line circuit 638 is input to the mux circuit. Additionally, the mux circuit 636 is connected to NOR circuit 634. The mux circuit 636 translates the output to up/down counter to an actual address to address the digital delay line 638. The PWM circuit 650 is connected to an input of the digital delay line circuit 636 to delay the rising edge of the pulses output from the PWM circuit 650. Additionally, the PWM circuit 650 is connected to the inverter circuit 640. The output of the inverter circuit 640 is connected to a similar delay controller as described herewith. Additionally, the output of inverter 640 is connected to the input of OR circuit 634. The output of OR circuit 634 is input to the gate of high-side power MOSFET 602.

The high-side power MOSFET 602 is controlled by the output of NOR circuit 634. pulse, from the NOR circuit 634, having a variable rising edge delay is input to the ate of high-side power MOSFET 602. Depending on the amount of time that high-side power MOSFET 602 is on, the high-side power MOSFET 602 controls the voltage $V_{OUT}$ by changing the duration of the pulse which controls the high-side power MOSFET 602. The voltage at terminal SW is sensed by comparator 624. The voltage circuit 620 outputs a voltage of minus 300 millivolts (this voltage is between φ and −700 millivolts) which is input to the comparator 624. Thus, the voltage at terminal SW must exceed 300 millivolts in order for the comparator 624 to output a signal to S-R latch 626. The comparator 624 is controlled by enable logic circuit 622 so that the comparator 624 can be selectively turned on and turned off in accordance with the enable logic circuit 622. The output signal from the comparator 624 is held by the S-R latch circuit 626 until a clock signal is received from the clock circuit 625. The S-R latch 626 holds the signal from comparator 624 in S-R latch 626 and outputs this signal from comparator 624 until a clock signal is received by the reset (R) of S-R latch 626 from CLK circuit 625, at which time the output of the S-R latch 626 returns to zero. When the output signal from the S-R latch 626 is received by the up/down counter 628, the up/down counter 628 is commanded to count down in accordance with the PWM clock signal. (The up/down counter counts down one for each PWM clock signal received.) The PWM clock signal occurs at each pulse signal from the PWM circuit 650, which is additionally input to up/down counter 628. Thus, the count of the up/down counter 628 is reduced.

The divide circuit 630 divides the clock signal output by clock circuit 625 which is input to the S-R latch 626 by M which is an arbitrary number which corresponds to the particular characteristics of the power supply. By increasing the value of M, the divide circuit 630 decreases the frequency of the output of the divide circuit 630. Decreasing the value of M, increases the frequency. The output of the divide circuit 630 is input to up/down counter 628. After the signal is received from the divide circuit 630, the up/down counter counts up in accordance with the PWM clock from the PWM clock circuit, increasing the counter inherent in up/down counter 628. The output of the counter inherent in the up/down counter 628 is output from the up/down counter 628 along bus 632 to mux circuit 636. Here, the mux circuit 636 decodes the count from the up/down counter 628 to an address that is appropriate to activate a delay corresponding to the counter from the up/down counter 628. Additionally, the mux circuit 636 decodes the output of the digital delay line 638, which is a delay, and inverts to the output of the NOR circuit 634 which is connected to the gate of the high-side power MOSFET 602. Thus, it can be seen that a plus voltage at terminal SW will not trigger the S-R latch or the up/down counter. However, when the voltage at terminal SW is less than 300 millivolts, or the voltage output from voltage circuit 620 in the negative direction, the up/down counter will be triggered, running down the internal counter of the up/down counter 628. The clock signal input to the S-R latch 626 is used by the divide circuit 630 to provide an up counter signal so that the delay does not become too small by missing the optimal point. If the optimal point should be missed and the delay becomes less than necessary, the up counter will increase the count on the internal counter of the up/down counter 628, resulting in the delay being lengthened until the optimal point is reached. Thus, by counting up and down the delay time is adjusted accordingly.

Figure 7:
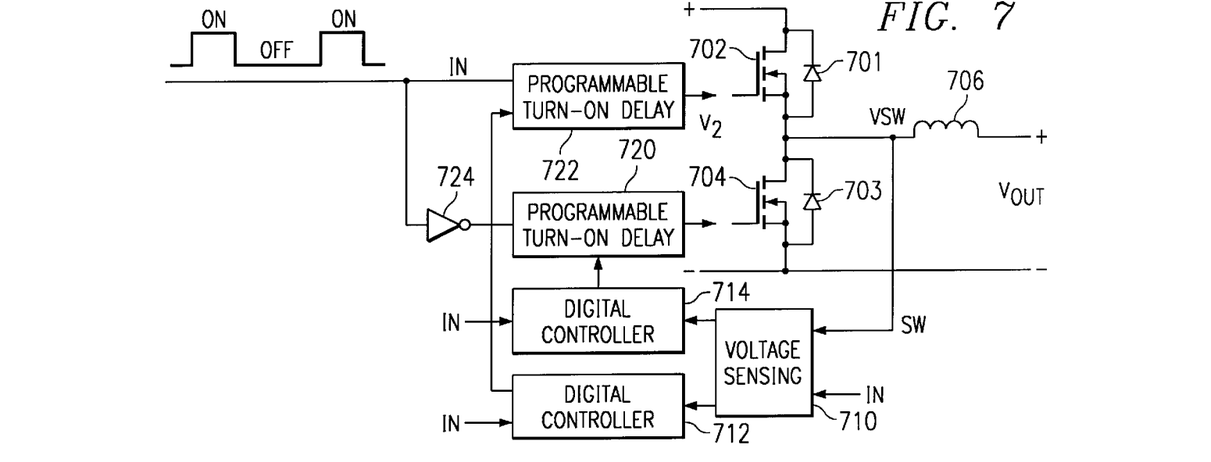
FIG. 7 illustrates a block diagram of the present invention.

FIG. 7 illustrates a block diagram of the control circuit for the DC-DC converter of the present invention. In FIG. 7, the high-side power MOSFET 702 is connected in a series with the low-side power MOSFET 704. In parallel with the respective high-side power MOSFET 702 and the low-side power MOSFET 704 is a body diode 701 and body diode 703. The voltage sensing circuit 710 is connected between the high-side power MOSFET 702 and the low-side power MOSFET 704. A first digital controller 712 and a second digital controller 714 are connected to the voltage sensing circuit 710. The first digital controller 712 is connected to the first programmable delay turn-on circuit 722, and inverter 724 is connected to receive the input signal from the PWM control circuit.

Turning now to the operation associated with the circuit of FIG. 7, the PWM control circuit generates ON pulses which vary in width and possibly frequency. These ON pulses are input to the first programmable turn-on delay circuit 722 which delays the pulses of the input signal in accordance with an amount that is determined by the first digital controller 712. Likewise, the pulses of the input signal are input to inverter 724 which inverts the pulses to generate an inverted pulse. The inverted pulse is input to second programmable turn-on delay circuit 720. The second programmable turn-on delay circuit 720 delays the inverted pulses to pulses in accordance with the delay signal from the second digital controller 714. The first programmable turn-on delay circuit 722 outputs a delayed signal to the high-side power MOSFET 702, and the high-side power MOSFET 702 conducts in accordance with the delayed pulse to generate a reduced voltage $V_{OUT}$. After the high-side power MOSFET 702 has finished conducting, a delay period occurs before the second programmable delay circuit 720 operates the low-side power MOSFET 704. A voltage sensing circuit 710 measures the voltage between the high-side power MOSFET 702 and the low-side power MOSFET 704. This measured voltage is compared with a reference voltage, and a compared voltage is generated, and the compared voltage activates either the first digital controller circuit 712 or the second digital controller circuit 714, depending on the state of "IN." FIG. 7 is applicable to all three topologies such as buck, boost and buck-boost.

Figure 8:
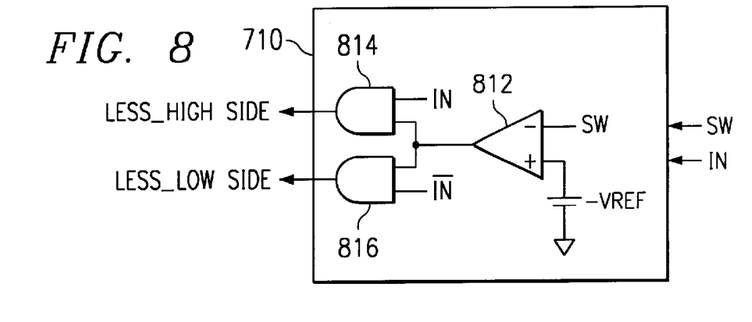
FIG. 8 illustrates a detail of the voltage sensing circuit of the present invention.

FIG. 8 illustrates details for a buck circuit of the voltage sensing circuit 710 for a buck. The voltage SW is compared with a reference voltage which is between 0 and less than the body diode forward drop by comparator 802. The voltage SW is input to the negative input of comparator 812. The negative reference voltage is input to the plus input of comparator 812. When the voltage SW is positive, it will not trigger the comparator 812. However, when the voltage SW is negative and greater in magnitude than the threshold voltage designated by the reference, an enable signal will output from comparator 812. This enable signal is input into first logic AND gate 814 and into second logic AND gate 816. Additionally input to the first logic AND gate 814 is input signal IN, as illustrated in FIG. 7, and inverted input signal $\overline{\text{IN}}$, which is the output of inverter 724, and is input to second logic AND gate 816. Output from first AND circuit 814 is a less high-side signal to indicate that less delay is required for the high-side power MOSFET 702. Output from second AND gate circuit 816 is a less low-side signal to indicate that less delay is required for low-side power MOSFET 704.

Figure 9:
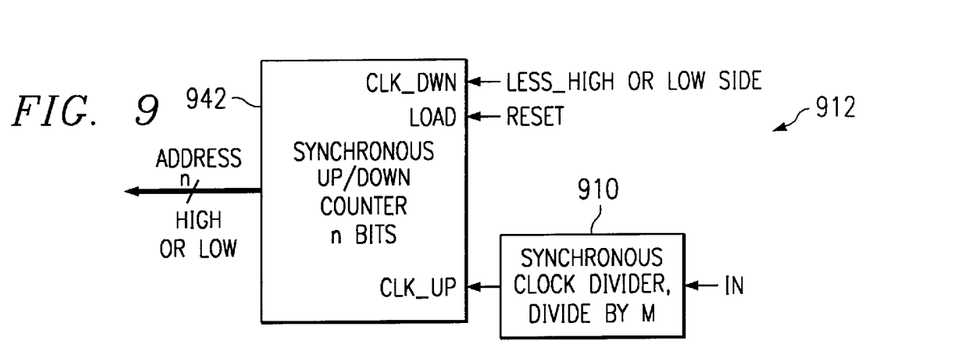
FIG. 9 illustrates a detail of the digital controller circuit of the present invention.

FIG. 9 illustrates a digital control circuit that is applicable for either first digital controller 712 or second digital controller 714. First digital controller 712 is actually illustrated in FIG. 9. One difference between the first digital controller 714 or the second digital controller 716 is the signal input to the clock down input of the synchronous up/down counter 712. The signal is either the less high-side signal or less low-side signal. The input signal IN is input to the divide circuit 910. The input IN signal is treated as a clock signal, the divide clock 910 divides the input signal IN by M and outputs the output signal for the up/down counter 912 to count up one in accordance with the PWM clock signal. A less high-side signal from AND circuit 814 is input to the up/down counter 912. Output from the up/down counter 912 is an address for either the first programmable delay circuit 720 (or the second programmable delay circuit 722 if the digital controller 714 was illustrated).

Figure 10:
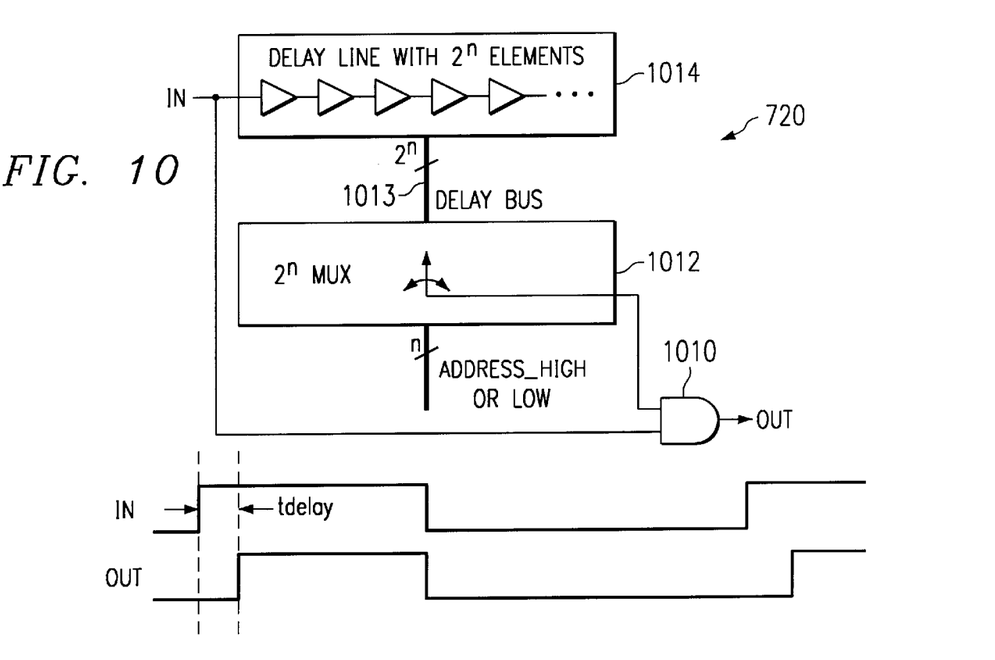
FIG. 10 illustrates a detail of the programmable turn-on delay circuit of the present invention.

FIG. 10 illustrates either a first programmable delay circuit 720 or second programmable delay circuit 722, respectively. For purposes of discussion, the first programmable delay circuit 720 is illustrated, but the explanation applies equally to the second programmable delay circuit 722. The address from up/down counter 912 is input to a mux circuit 1012. The mux circuit 1012 includes three ports for I/O. The mux circuit 1012 has two input ports, both busses, if one input bus 632 from up/down counter 628 is n bits wide, a second input bus 631 for the mux circuit 1012 is 2^n bits wide to input the delay from the digital delay line 638. The third port 633 is an output port to output the actual delay to be used by the programmable delay turn-on circuit. The first input bus 634 is the address bus, which directs the second bus 631 to put on the output port 633 the delays. Data flows from the second bus 631 to the output port 633.

Figure 13:
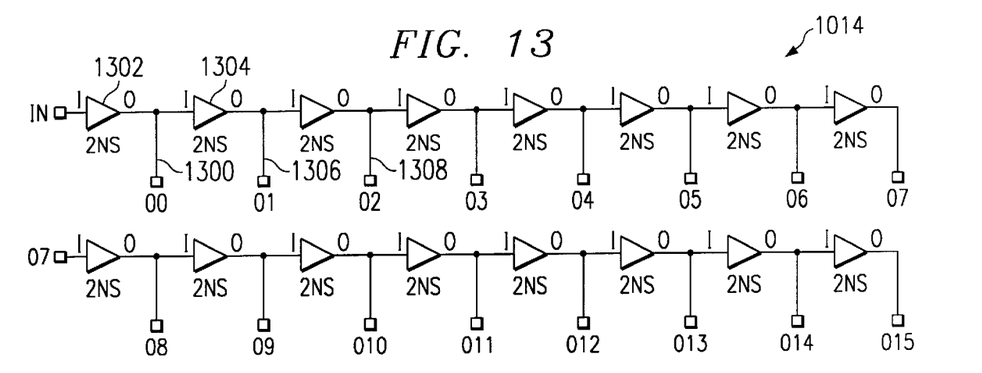
FIG. 13 illustrates a detail of the delay lines of the present invention.

Turning now to FIG. 13, a more detailed diagram of the delay circuit 1014 is illustrated. The mux circuit 1210 addresses one of the terminals of delay circuit 1014 such as terminal 1306. Consequently, the input signal is input to delay circuit 1302 at 1300 and then the output of delay circuit 1302 is input to delay circuit 1304. Each terminal of delay circuit 1302 and delay circuit 1304 has 2NS of delay. Furthermore, each terminal adds 2NS of delay to the total delay of delay circuit 1014. Consequently, a total of 4NS delay is output from 1306. If additional or less delay is required, other terminals are selected. Terminal 1308 will add another 2NS of delay while terminal 1310 will reduce the delay by 2NS. This increases or decreases the delay by adding or reducing delay elements.

Turning back to FIG. 10, the delay line circuit 1014 outputs the delayed signal, for example the delayed IN signal as illustrated in FIG. 10 to delay bus 1013 and then to mux circuit 1012. The delayed signal is output from mux circuit 1012 to AND circuit 1010. The purpose of AND 1010 is to delay only the turn-on or rising edge of the IN signal. Additionally, the input signal is input to AND circuit 1010 and then delayed signal which is delayed with respect to the OUT signal indicated at the bottom of FIG. 10. The output of AND circuit 1010 is input to the gate of either the high-side power MOSFET or the low-side power MOSFET.

Figure 11:
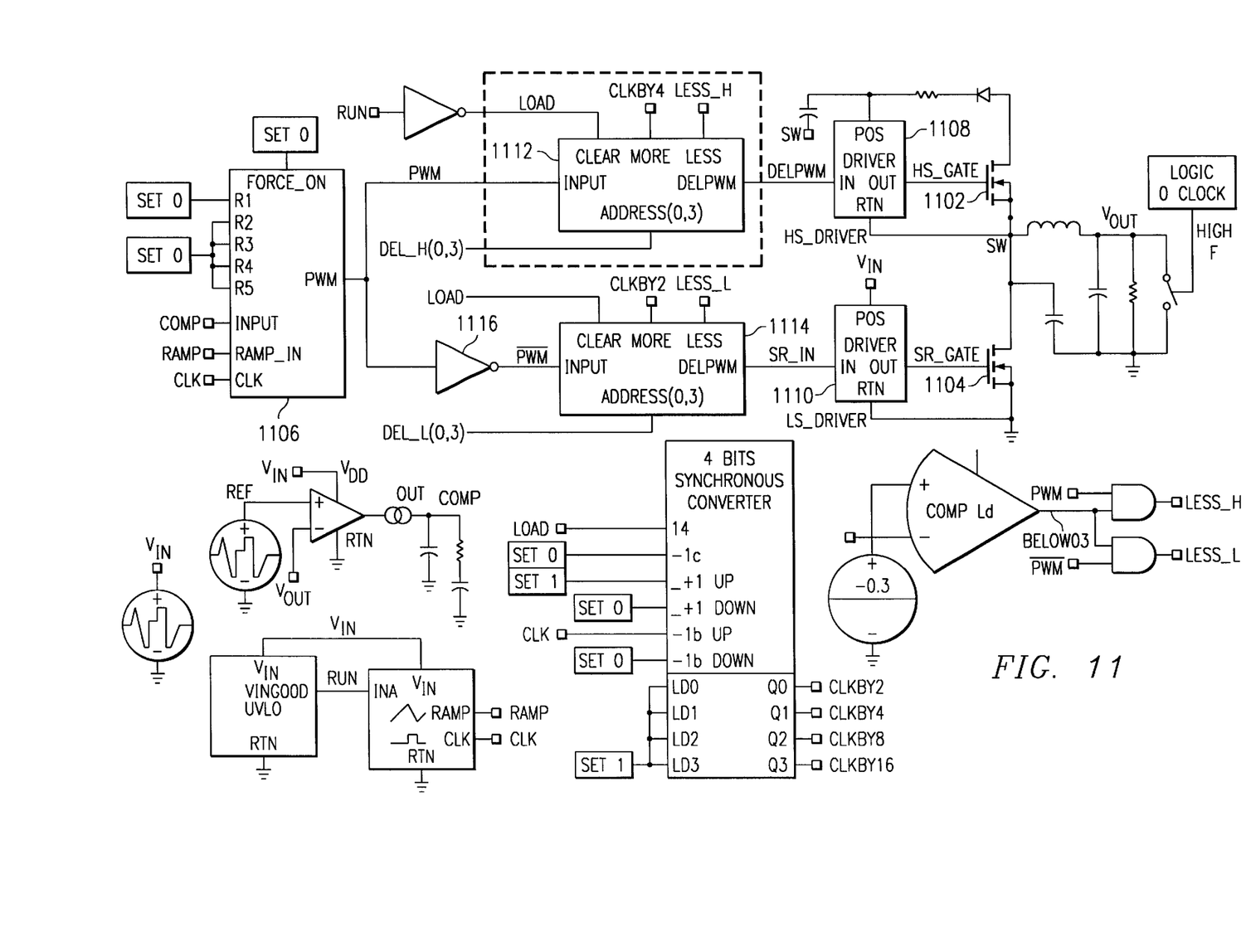
FIG. 11 illustrates an implementation of the present invention.

FIG. 11 illustrates an implementation of the present invention including the high-side MOSFET 1102, the low-side MOSFET 1104, MOSFET drivers 1108, 1110, PWM control circuit 1106, the high-side counter circuit 1112, the low-side counter circuit 1114, and the inverter 1116.

Figure 12:
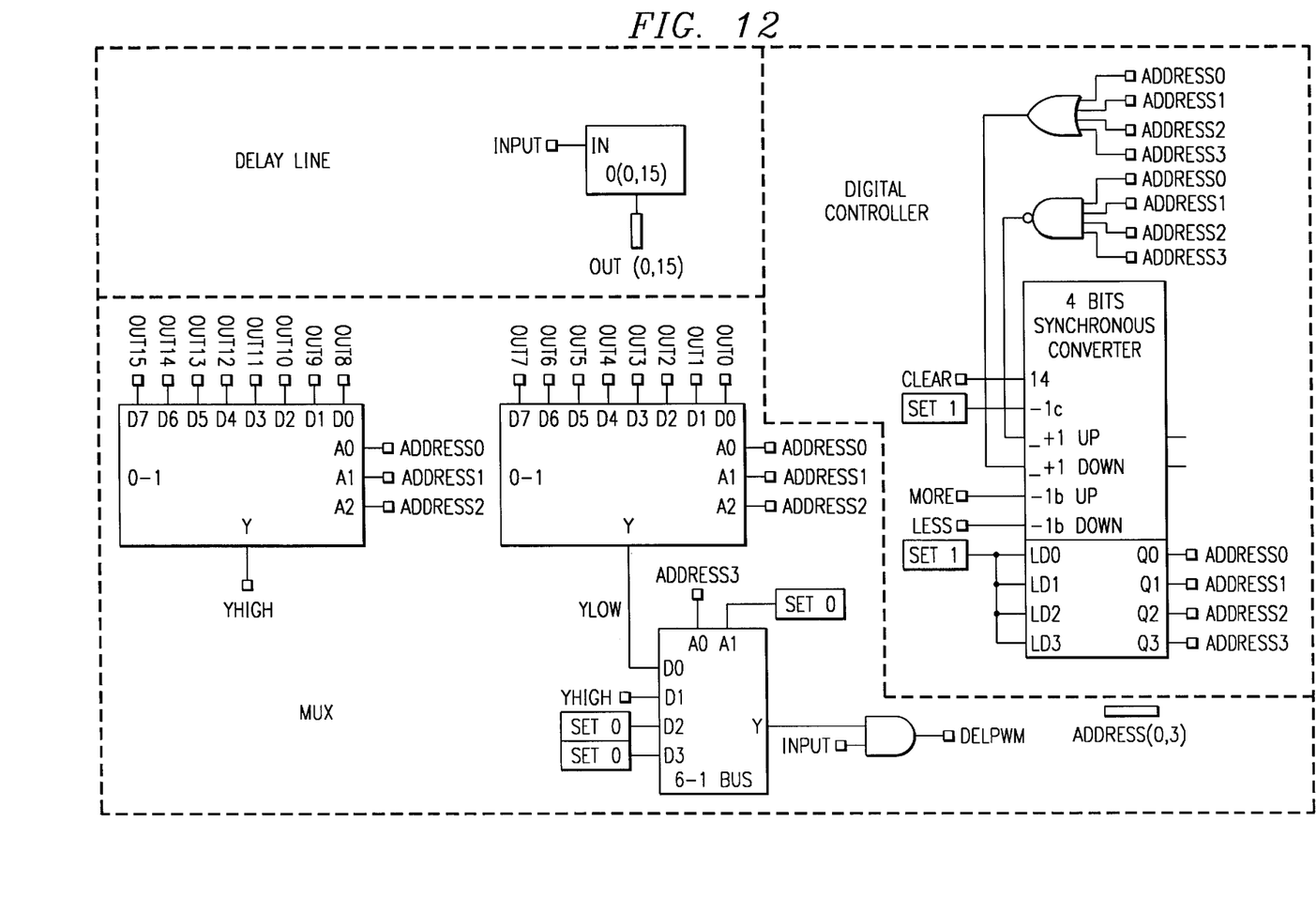
FIG. 12 illustrates the interface between the delay line and the digital controller of the present invention.

FIG. 12 illustrates an implementation of the delay line circuit with the digital controller.

Figure 14:
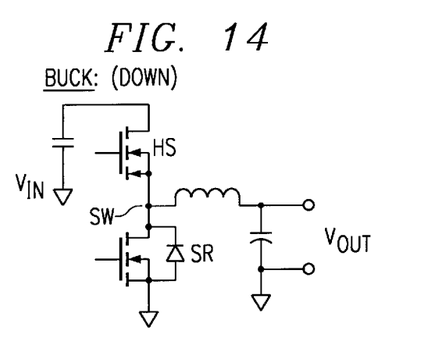
FIG. 14 illustrates a buck circuit that can be used with the present invention.

FIG. 14 illustrates a buck circuit that can be used in accordance with the teaching of the present invention and indicates the voltage through terminal SW.

Figure 15:
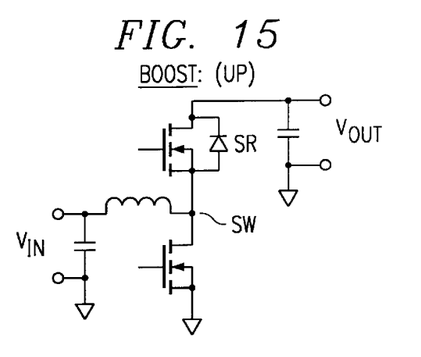
FIG. 15 illustrates a boost circuit that can be used with the present invention.

FIG. 15 illustrates a boost circuit which may be used with the teaching of the present invention, again illustrating the terminal SW.

Figure 16:
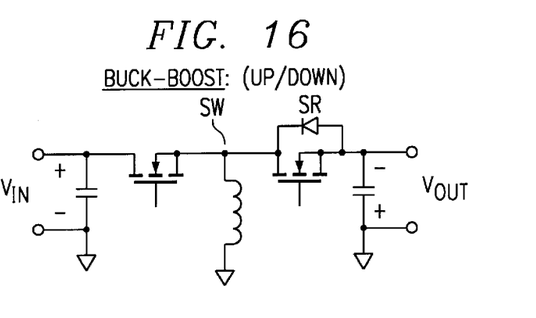
FIG. 16 illustrates a buck-boost circuit that can be used with the present invention.
Figure 17:
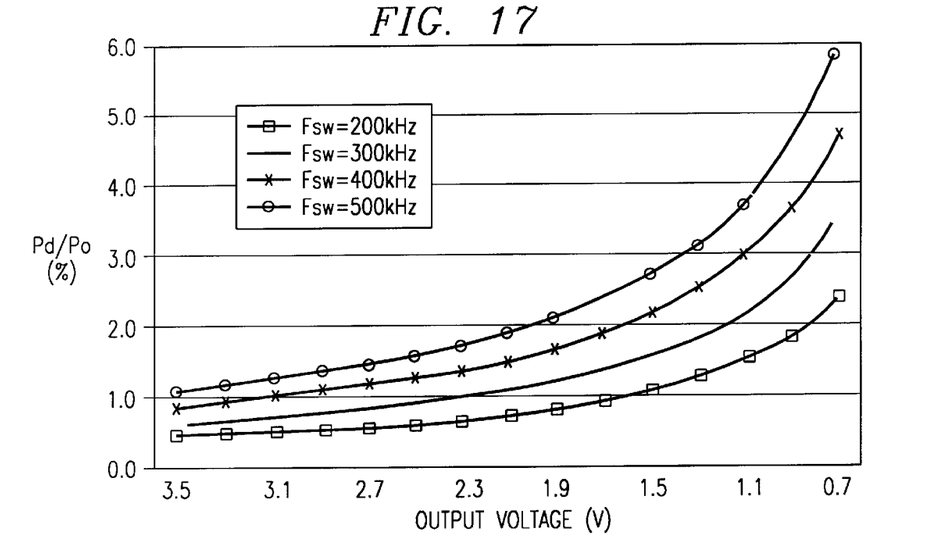
FIG. 17 illustrates a graph illustrating the power dissipated in the body diode for various operating conditions.

FIG. 16 illustrates a buck-boost circuit, again illustrating terminal SW which may be used with the teaching of the present invention.

Figure 18A:
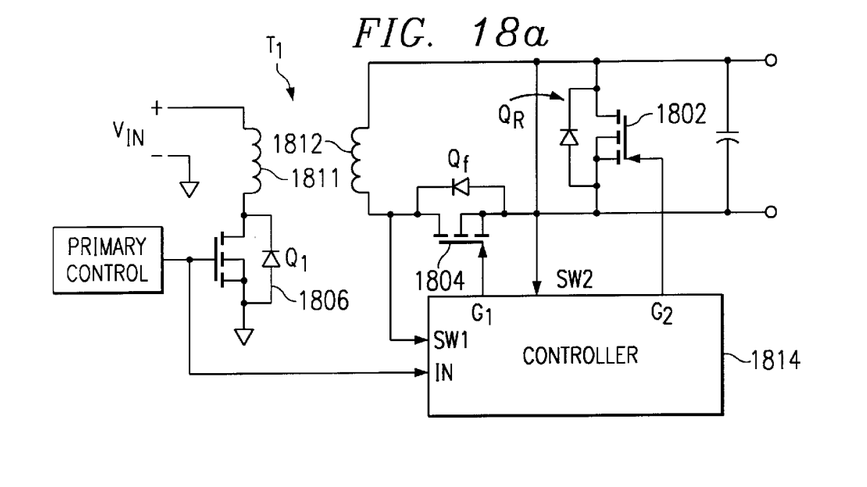
FIGS. 18a & 18b illustrates a forward converter.

FIG. 18a are three switches, switch 1806 on the primary side 1810 of a transformer 1812 and switch 1802 and switch 1804 on the secondary side of transformer 1812. The transformer 1812 has a turns ratio of N=Np/Ns. The primary side 1810 of the transformer 1812 includes the winding connected to switch 1806 and $V_{IN}$. The output voltage of transformer 1812 is regulated by a closed loop feedback system (not shown). The average output voltage of transformer 1812 will be regulated at Vo=D*Ns/NP*$V_{IN}$. Note that if Ns>Np, Vo can be higher that $V_{IN}$. Also conversely, if Np>Ns, Vo will be lower than $V_{IN}$. This converter is called a "forward" and is a transformer coupled version of the buck converter. The invention applies to the control of the three switches.

Operation of the forward circuit is quite similar to the buck circuit already described hereinabove. The switch 1806 is additional, while switch 1804 is similar to the high-side switch of the buck controller, and switch 1802 is the same as the SR switch of the buck controller. Note that in the forward topology, switch 1804 and switch 1806 are SR type of switches.

The controller 1814 on FIG. 18a contains two circuits like that which is described in FIG. 6. The main differences are the SW input on FIG. 6 becomes SW1 or SW2, depending which switch is being controlled. The PWM input, marked 650 comes from the primary side, which is the Vgs of switch 1806.

One delay block as described in FIG. 6 is used to control switch 1804 and one is dedicated to control switch 1802. The inputs are clearly labeled, signal SW1 is the feedback signal which controls the turn-on delay for G1, which drives Qf. SW2 controls the turn-on delay for G2, which drives Qr.

Figure 18B:
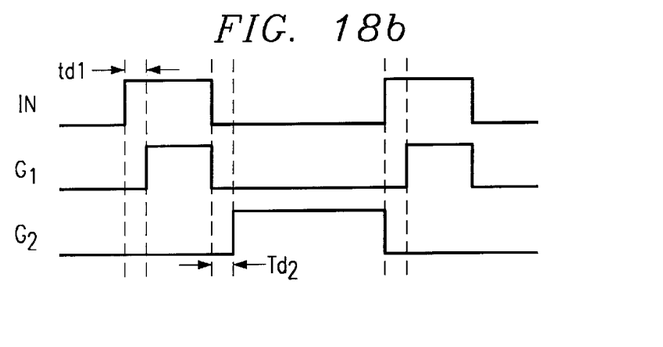

The waveforms on FIG. 18b show the turn-on delay td1 and td2.

What is claimed is:

1. A DC-to-DC converter to convert a first DC voltage to a second DC voltage, comprising:
   a first switch connected to input said first DC voltage;
   a second switch, said first switch and said second switch being controlled by an input signal to generate said second DC voltage;
   said first switch and said second switch being compared to a control reference; and
   a control circuit to control the delay of said input signal by monitoring the control reference around an optimal delay point wherein said control circuit includes an up/down counter.

2. A DC-to-DC converter, as in claim 1, wherein said up/down counter counts up after a predetermined number of clock cycles.

3. A DC-to-DC converter, as in claim 1, wherein said control reference is a voltage.

4. A DC-to-DC converter, as in claim 1, wherein said control reference is measured between said first switch and said second switch.

5. A DC-to-DC converter, as in claim 1, wherein said up/down counter counts down after a threshold voltage has been reached.

6. A DC-to-DC converter, as in claim 1, wherein said DC-to-DC converter is analog.

7. A DC-to-DC converter, as in claim 1, wherein said DC-to-DC converter is digital.

8. A DC-to-DC converter, as in claim 1, wherein said control circuit controls a delay circuit.

9. A DC-to-DC converter to convert a first DC voltage to a second DC voltage, comprising:
   a first switch connected to input said first DC voltage;
   a second switch, said first switch and said second switch being controlled by an input signal to generate said second DC voltage;
   said first switch and said second switch being compared to a control reference; and
   a control circuit to control the delay of said input signal by monitoring the control reference around an optimal delay point wherein said control circuit includes an up/down counter to count down until said optimal delay part is approximately reached.

10. A DC-to-DC converter to convert a first DC voltage to a second DC voltage, comprising:
    a first switch connected to input said first DC voltage;
    a second switch, said first switch and said second switch being controlled by an input signal to generate said second DC voltage;
    said first switch and said second switch being compared to a control reference; and
    a control circuit to control the delay of said input signal by monitoring the control reference around an optimal delay point wherein said control circuit includes an up/down counter to count down until said optimal delay part is approximately reached and then to count up.

* * * * *